United States Patent [19]

Choi

[11] Patent Number: 5,149,667
[45] Date of Patent: Sep. 22, 1992

[54] MASK ROM DEVICE HAVING DOUBLE POLYCRYSTALLINE SILICONE AND PROCESS FOR PRODUCING THE SAME

[75] Inventor: Jeongdal Choi, Suwon, Rep. of Korea

[73] Assignee: Samsung Electronics Co., Ltd., Rep. of Korea

[21] Appl. No.: 576,594

[22] Filed: Aug. 31, 1990

Related U.S. Application Data

[62] Division of Ser. No. 490,746, Mar. 8, 1990, abandoned.

[30] Foreign Application Priority Data

May 31, 1989 [KR] Rep. of Korea .......... 89-7341

[51] Int. Cl.⁵ .......... H01L 21/70; H01L 27/00
[52] U.S. Cl. .......... 437/52; 437/193; 437/195; 357/41; 357/235
[58] Field of Search .......... 437/52, 193, 195; 357/41, 23.5; 365/104

[56] References Cited

U.S. PATENT DOCUMENTS

| | | | |
|---|---|---|---|
| 4,328,563 | 5/1982 | Schroeder | 357/41 |
| 4,665,295 | 5/1987 | McDavid | 437/52 |
| 4,696,092 | 9/1987 | Doering et al. | 437/52 |
| 4,818,716 | 4/1989 | Okuyama et al. | 437/52 |
| 4,851,365 | 7/1989 | Jeuch | 437/193 |

FOREIGN PATENT DOCUMENTS 2-288260 1/1990 Japan .......... 437/52
2-113582 4/1990 Japan .......... 437/52

Primary Examiner—Brian E. Hearn
Assistant Examiner—Kevin M. Picardat

[57] ABSTRACT

A mask ROM device having a NAND type high integration double polycrystalline silicon and a process for producing the same. The invention includes a first conductive type semiconductor substrate, a field oxide film, a channel stopper, a second conductive type diffusion region, third and fourth conductive type channels, a gate oxide film, a number of first polycrystalline silicon gates, a number of second polycrystalline silicon gates, insulating film, and a metal film the metal film is manufactured by forming an ion plantation region, a third conductive type channel, and forming sequentially a first gate oxide film, a first gate electrode substance oxide film, a nitride film and LTO film, etching all of them whereby forming a first gate electrode and exposing the substrate, forming a spacer, a second gate electrode, an opening, and programming into a fourth conductive type channel, and forming a diffusion region or source and rain, and then forming an insulating film, connecting opening, and a metal film. According to the invention, the area of the chip can be greatly reduced, reliability can be improved because it is programmable only to selected memory cells. Resistance of the word line is decreased, and active resistance is decreased.

6 Claims, 7 Drawing Sheets

MASK ROM DEVICE HAVING DOUBLE POLYCRYSTALLINE SILICONE AND PROCESS FOR PRODUCING THE SAME

This is a division of application Ser. No. 07/490,746, filed Mar. 8, 1990 now abandoned.

BACKGROUND OF THE INVENTION

The present invention relates to a semiconductor memory device of and process for producing the same, and more particularly, to a mask ROM device having NAND type high integration double polycrystalline silicon and process for producing the same.

A Mask ROM (Mask Read Only Memory) is a read only memory device that is unable to change data after the data is fixed in a process for producing elements. However, since the structure of a cell is simple, the degree of integration is the highest among semiconductor memory devices, and the same data can be simultaneously programmed to a plurality of semiconductor devices in the case of manufacturing elements, which can be programmed at little expense, thereby creating an advantage in the pricing of elements.

The method of programming mask ROM is generally divided into two steps, one of which is that a manufacturer determines the data previously, and another is that data is programmed by the designation of a user. In the case where data is programmed by the designation of a user as aforementioned, after the process is executed just prior to the process for programming and the data is programmed according to the order of a user, the elements are manufactured by executing the remaining process.

Recently, a cheap mask ROM of a large capacity has become required due to the tendency to make the character font of high resolution and high sound quality in OA instruments, electronic musical instruments, and TV games. In response to the tendency to produce high integration semiconductor devices as described previously, U.S. Pat. No. 4,142,176 proposes a mask ROM device having a NAND cell (hereinafter called as a memory string). The equivalent circuit of said memory string is shown in FIG. 1, and a memory cell array is organized with a plurity of memory strings arranged by a matrix system in rows and columns. Said memory string MS is organized with a string selection transistor ST connected to a bit line that the drain corresponds thereto, and MOS transistors MC1-MC8 of 8 bits have drain-source paths serially connected between the source of said string selection transistor ST and the ground line. In addition, the gates of the string selection transistors ST and the gates of the MOS transistors MC1-MC8 are connected respectively with the string selection line SSL and the word lines WL1-WL8 which are row lines parallel to each other.

Hereinafter, the reading operation of said NAND type mask ROM device will be described with reference to FIG. 1. It will be described by exemplifying that of programmed with fourth memory cell MC4 contained within memory string MS.

When a reading voltage of about 1-2V is applied to the selected bit line BL and the power source voltage VCC is applied to the selected string selection line SSL, the string selection transistor ST is "turned on". Furthermore, reading is accomplished by applying OV to the word line WL4 connected to the gate of the selected fourth memory cell MC4 and by applying the power source voltage VCC to word line connected to the gates of the remaining non-selected MOS transistors. That is, when the selected fourth memory cell MC4 is in enhancement-type, a reading voltage applied to the bit line BL is transferred through the "turned on" string selection transistor ST and memory cells MC1-MC3 to the drain of the fourth memory cell MC4. However, since the fourth memory cell MC 4 is in the "off" state, the "off" state is sensed by preventing that reading voltage applied to said bit line BL being discharged through the memory cells MC5-MC8 to the ground line. In case the fourth memory cell MC4 is in a depletion state, the reading voltage applied to said bit line BL is transferred through the "turned on" string selection transistor ST and the memory cells MC1-MC8 to the ground line whereby the "on" state is sensed.

FIG. 2 is a plan view of a memory string in a mask ROM having the conventional NAND cell. It will be easily understood that a memory array has a plurality of memory strings.

FIG. 3 shows a cross sectional view taken along the line a—a' of FIG. 2. The memory string MS has N+ diffusion regions 14, 16 separated by a channel region 17 on the surface of the P-type semiconductor substrate 10. The gate 20 is formed with polycrystalline silicon on the top portion of a gate oxide film 22 on said channel region 17.

A metal film 18 formed by aluminum and utilized into the bit line BL forms a contacting surface 12 by contacting the N+ diffusion region 14 through the opening formed on the top portion of the N+ diffusion region 14.

Furthermore, said N+ diffusion region 16 owns jointly with adjacent memory cells thereby becoming source and drain regions.

Returning to FIG. 2, the bit line BL made of the metal film 18 expanding in row is connected to the N+ diffusion region 14 formed within P-type semiconductor substrate 10 through the contacting opening 13. Said N+ diffusion region 14 is connected with the drain of the string selection transistor ST of the memory string MS.

The source of said string selection transistor ST is connected with the drain of the first memory cell MC1. Furthermore, the drain-source paths of the memory cells MC1-MC8 contained within the memory string MS is serially connected between the drain of said string selection transistor ST and the ground line. Oblique lined regions 15 are string section line SSL and the word lines WL1-WL8 formed with the polycrystalline silicon, wherein the regions crossing with the bit line BL are the gates of the string selection transistor ST and the memory cells MC1-MC8.

Since the NAND type mask ROM device as described above has a broad insulating area for isolating the memory cells serially connected through the diffusion layer to one memory string, there has been a problem of the setting limits for high integration of a memory cell array.

SUMMARY OF THE INVENTION

Therefore, it is an object of the present invention to provide a mask ROM device having an integration double polycrystalline silicon and a process for producing the same capable of minimizing the isolation between memory cells in the mask ROM memory device having a NAND cell.

In order to accomplish the object as described above, the present invention comprises:

a semiconductor substrate of a first conductive type, a field oxide film formed at a side of the surface of said semiconductor substrate;

a channel stopper formed under said field oxide film, a diffusion region of a second conductive type formed at another side of the surface of said semiconductor substrate;

channels of third and forth conductive types formed on the surface of the semiconductor substrate between said second conductive type diffusion region and field oxide film;

a gate oxide film formed on the surface of said semiconductor substrate;

a plurality of first polycrystalline silicon gate formed to be separated at a predetermined distance on the top portion of the gate oxide film between said second conductive type diffusion region and field oxide film;

a plurality of second polycrystalline silicon gate isolated by said first polycrystalline silicon gate and spacer as well as an oxide film & a nitride film;

an insulating film formed on the top portion of said first and second polycrystalline gates, and a metal film formed on the top portion of said insulating film and make contact with said second conductive type diffusion region through the contacting opening.

BRIEF DESCRIPTION OF THE DRAWINGS

The foregoing and other objects as well as advantages of the present invention will become clear by following description of the invention with reference to the accompanying drawings, wherein.

Throughout the drawings, reference numbers and symbols are used for designating equivalent parts and portions to simplify illustration and explanation.

DETAILED DESCRIPTION OF THE INVENTION

Hereinafter, the present invention will be described in detail with reference to the accompanying drawings.

Figure 4:
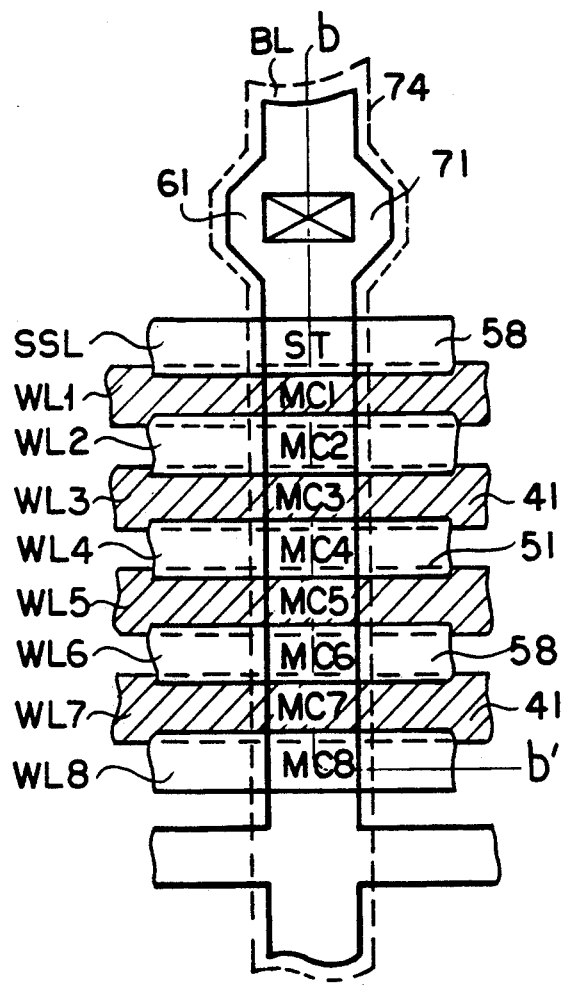
FIG. 4 is a diagram of lay-out arrangement of a mask ROM device according to the present invention.

FIG. 4 is a plane view of a memory string in a mask ROM device according to the present invention.

It will be easily understood that array has a plurality of memory strings.

Figure 1:
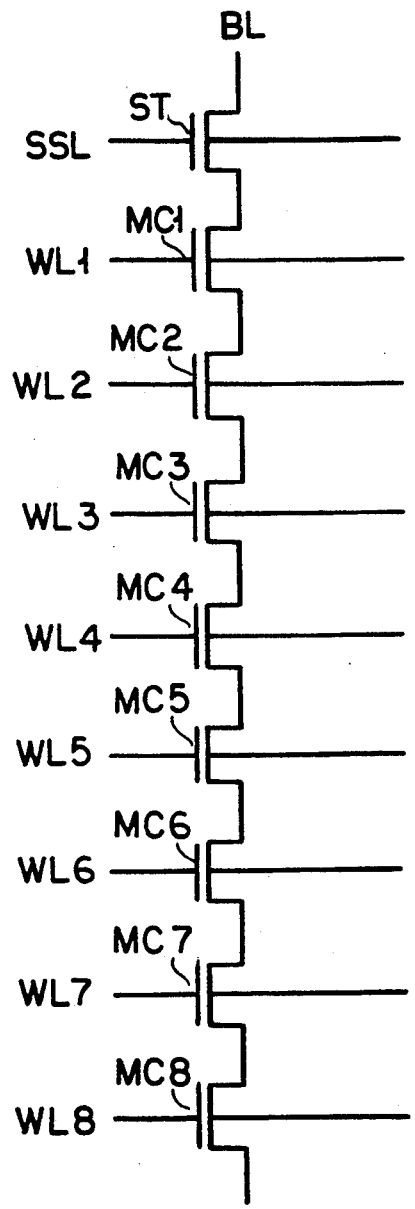
FIG. 1 is a circuit diagram of the conventional mask ROM device having a NAND cell.
Figure 2:
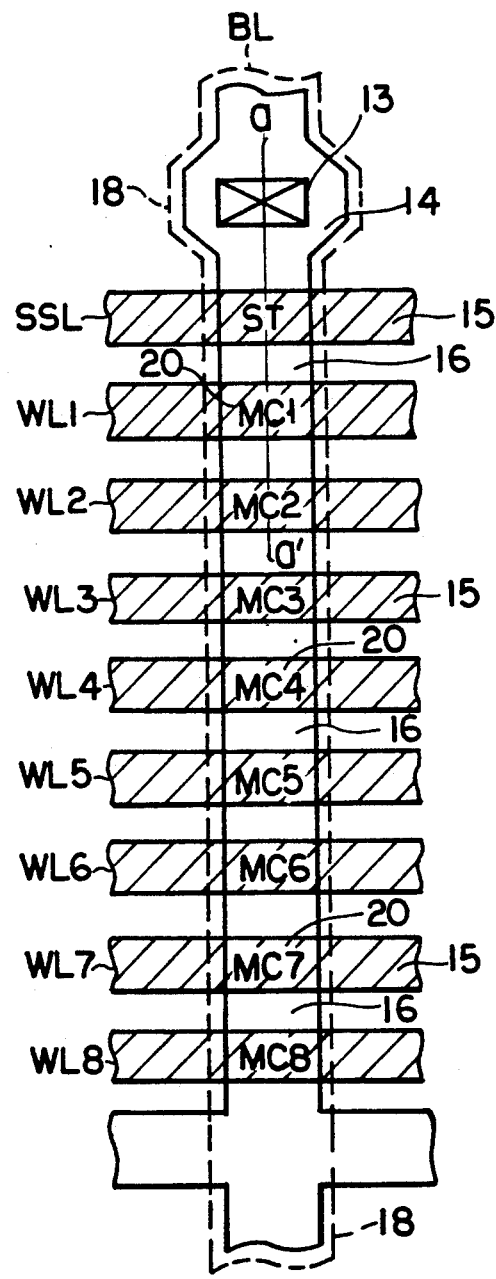
FIG. 2 is a diagram of lay-out arrangement of conventional mask ROM device having a NAND cell.
Figure 3:
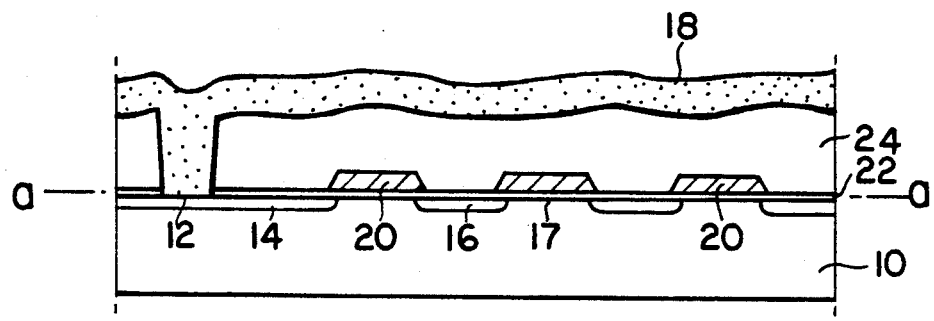
FIG. 3 is a cross sectional view taken along a—a' line of FIG. 2.
Figure 5:
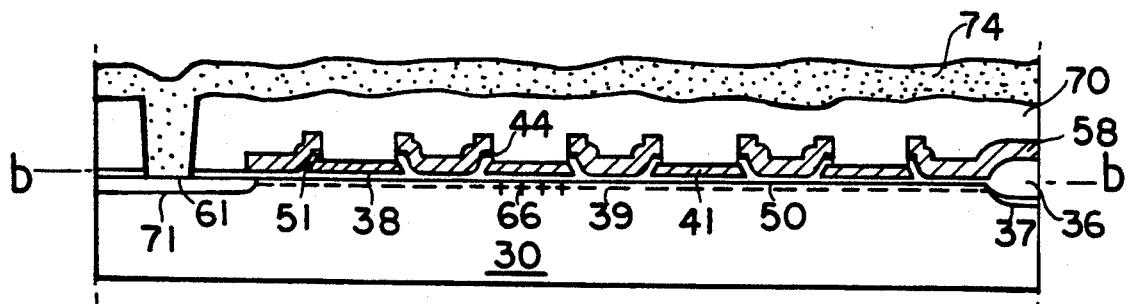
FIG. 5 is a cross sectional view taken along b—b' line of FIG. 4, and FIGS. 6(A) to 6(I) are diagrams of manufacturing process according to b—b' line of FIG. 4.

FIG. 5 is a cross sectional view taken along line b—b' of FIG. 4, in which, a field oxide film 36 for isolating an N+ diffusion region 71 and a memory string MS adjacent to it is formed on the surface of a P-type semiconductor substrate 30. Channels are formed between said N+ diffusion region 71 and the field oxide film 36, and said channels are classified into the depletion N-channel 39 and the enhancement N channel 66.

Furthermore, the first gate electrodes 41 formed with the first gate electrode substance and separated to a plurality are separated by a first gate oxide film 38 and formed on the top portion of said channel regions 39, 66. A plurality of second gate electrodes 58 made of second gate electrode substance are formed on the top portion of the second gate oxide film 50 between said first gate electrodes 41. Each part of said first and second gate electrodes 41, 58 are superposed, and they are isolated with one another by the second gate oxide film 50, nitride film 44 and spacer 51 formed of insulating film between said superposed part.

Said first and second gate electrodes 41, 58 are formed of polycrystalline silicon or polycide such as tungsten silicide, titanium silicide and molybdenum silicide. Furthermore, a metal film 74 formed of aluminium and so on and utilized as bit line BL is connected with said N+ diffusion region 71 through the opening formed to the thick insulation film 70 on the top portion of the N+ diffusion region 71.

A memory cell having a P channel formed for interposition on said N channel 39 represents that data are programmed.

Returning to FIG. 4, a bit line BL made of the metal film 74 expanded in row is connected to the N+ diffusion region 71 formed within the P-type semiconductor substrate 30 through the contacting opening 61. Furthermore, first, third, fifth and seventh word lines WL1, WL3, WL5, WL7 formed of the first gate electrode substance as well as the string selection line SSL and second, fourth, sixth and eighth word lines WL2, WL4, WL6, WL8 formed of the second gate electrode substance are superposed partly with manually neighbouring lines.

Therefore, the string selection transistor ST and each memory cell MC1-MC8 is partly superposed with the mutually neighbouring cells, and the channels 39, 66 are formed under them. Further, spacers 1, the gate oxide film 50 as well as the nitride film 44 are between the neighbouring transistors. Therefore, since the string selection transistor ST and each memory cell MC1-MC8 are formed by superposing so as to be spaced apart by the spacer 51 and the oxide film 50 as well as the nitride film 44, it is possible to obtain the mask ROM device having high density memory cells.

FIGS. 6(A)-6(H) are diagrams of a manufacturing process according to the present invention which forms the structure shown in FIG. 4.

The starting material is a P-type silicon substrate having <100> direction a and resistance of 5-50 ohms-cm.

Figure 6A:
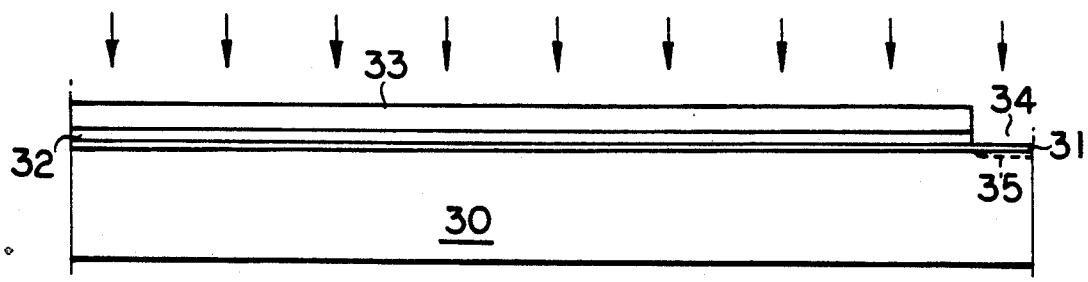

Referring to FIG. 6(A) now, the P-type substrate 30 may be either a substrate of said starting material or a P-well formed on the P-type substrate as well. The pad oxide film 31 of about 400 Å and nitride film 32 of about 1200-1500 Å in thickness as well as a photoresist film 33 are sequentially formed on the surface of said substrate 30, and then the opening 34 defined with a field region is formed by a known photo-etching technique. Thereafter, boron B of P-type impurities is implanted by 30 KeV and Doze $5 \times 10^{13}/cm^2$ through the opening 34 in order to raise the threshold voltage of the field region whereby an ion implantation region is formed.

Figure 6B:
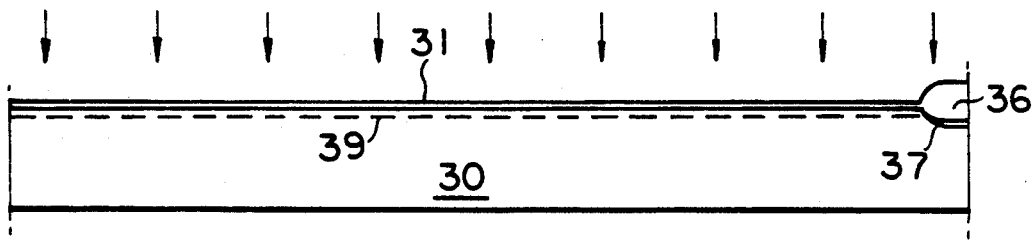

Referring to FIG. 6(B), after said process, in the case where the field oxide film 36 is formed with a thickness of more than 5000 Å by oxidizing the field region, the ion plantation region 35 is diffused and become the channel stopper 37. Thereafter, the photoresist film 33 and the nitride film 32 remaining at active region formed with the memory strings and N+ diffusion regions are removed, and subsequently arsenic As of N-type impurities is implanted by 100 KeV and Doze $1.0\times10^{12}-3.0\times10^{12}/cm^2$ to said active region whereby the enhancement N-channel 39 is formed. The ion implantation of said N-type impurities turns the memory string into a depletion type.

Figure 6C:
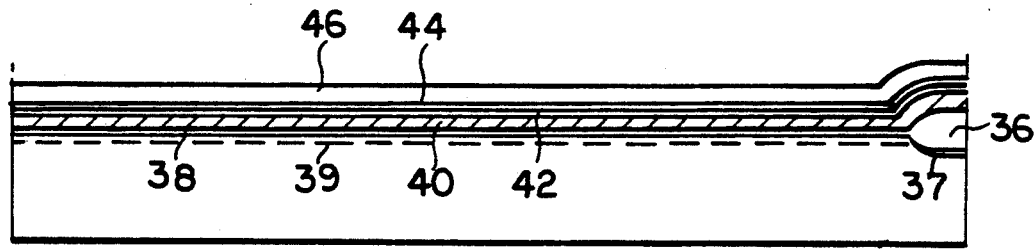

Referring to FIG. 6(C), after said process, the pad oxide film 31 is removed by wet etching, and successively the first gate oxide film 38 is grown to a thickness of about 250 Å. Thereafter, a first gate electrode substance 40 of about 2000 Å in thickness, an oxide film 42 of about of 2000 Å in thickness, the nitride film 44 of about 300 Å in thickness, and an LTO film 46 of about 2500 Å in thickness are sequentially formed on the top portion of said first gate oxide film 38. The first gate electrode substance 40 may be either polycrystalline silicon or polycide such as tungsten silicide, titanium silicide and molybdenum silicide.

Figure 6D:
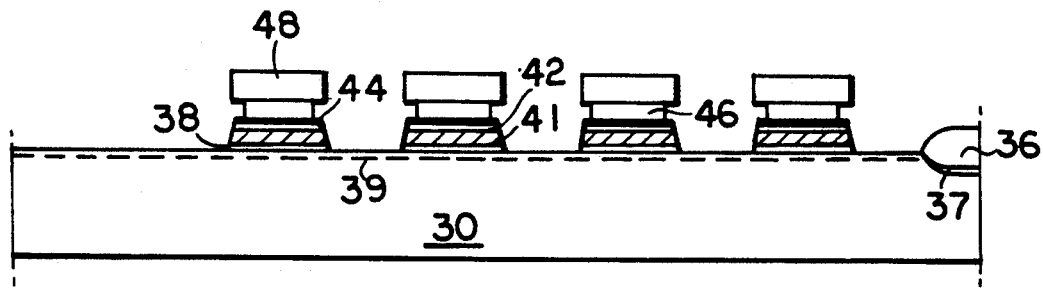

Referring to FIG. 6(D), the first gate electrode region is defined on the top portion of said LTO film 46 by a lithographic technique, and then remaining part is removed by dry etching method. In other words, the photoresist film pattern 48 defining the first gate electrode region is formed by the lithographic technique, and then the LTO film 46, the nitride film 44, the oxide film 42, the first gate electrode substance 40, and the first gate oxide film 38 are sequentially removed by applying said photoresist film pattern 48 as an etching mask.

Figure 6E:
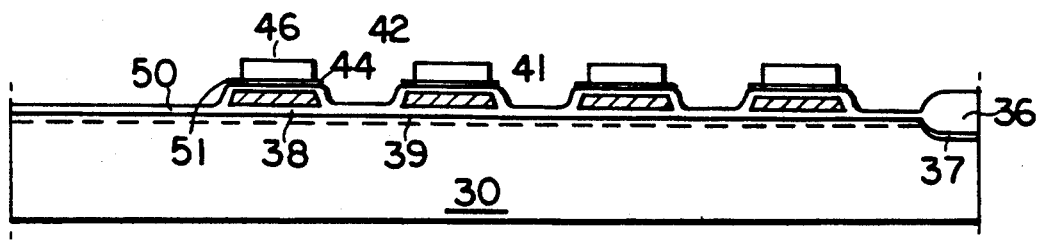

Referring to FIG. 6(E), after said photoresist film pattern 48 is removed, the second gate oxide film 50 having a thickness of 250 Å is grown. At this moment, the oxide film is also grown at the side walls of the first gate electrodes 41 where the spacer 51 is formed. Said second gate oxide film 50 is the same as the first gate oxide film 38.

Figure 6F:
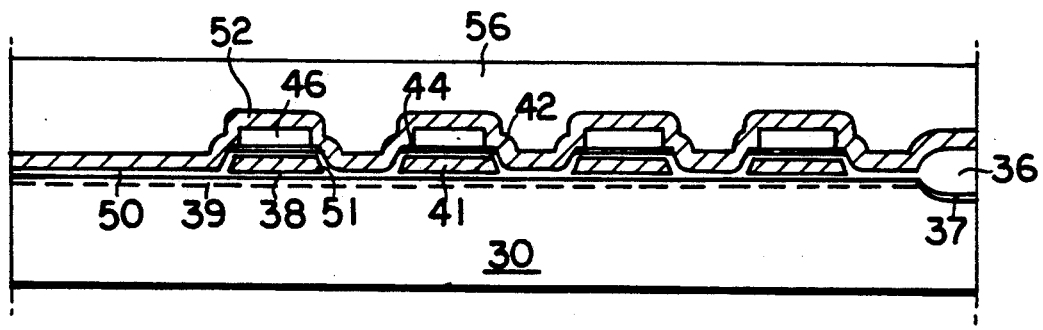

Referring to FIG. 6(F), the second gate electrode substance 52 of about 2000 Å in thickness and the photoresist film 56 are sequentially formed on the top portion of the second gate oxide film 50 and LTO film 46. Hereupon, after the second gate electrode substance 52 is deposited, POC13 is doped for dropping the resistance.

Figure 6G:
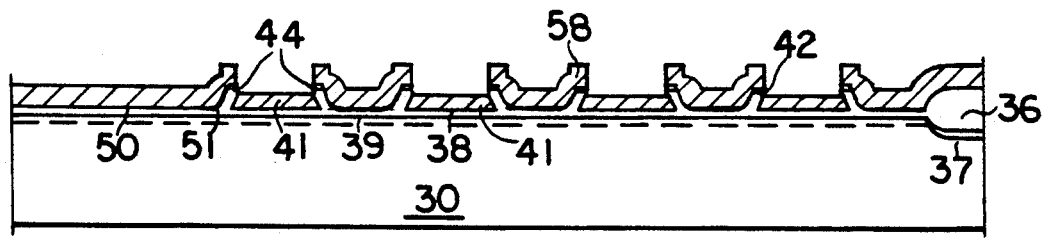

Referring to FIG. 6(G), region of the second gate electrodes is defined to the second electrode substance 52 on the LTO film 46 by a known lithographic technique, and then the second gate electrode substance 52 of remaining region is removed by an etching back process so that the second gate electrodes 58 are formed. Then, the LTD film 46, the nitride film 44 and the oxide film 42 are sequentially etched, and the photoresist film 56 is also removed, wherein said LTO film 46 is etched by wet method, and nitride film 44 and oxide film are etched by dry method.

Hereupon said nitride film 44 and oxide film 42 remain in superposing portions between the first and second gate electrodes 41, 58, thereby electrically isolatively lying between said first and second gate electrodes 41, 58. The second gate electrodes 58 on the first gate electrodes 41 should be higher than the second gate electrodes 58 on the field oxide film 36.

Figure 6H:
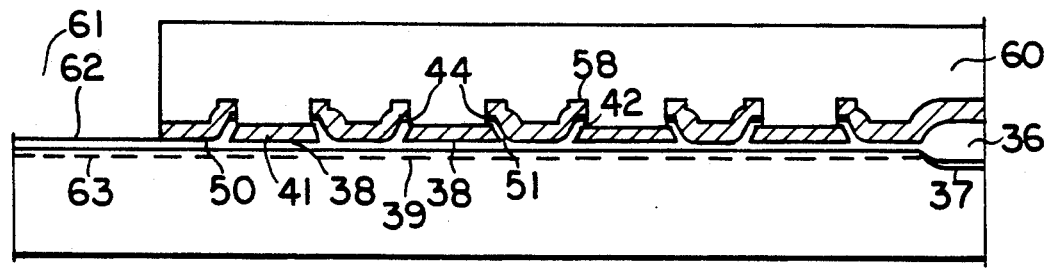

Referring to FIG. 6(H), after the photoresist film 60 is spread, the second gate electrode 58 of the region formed due to contact with the lithographic method is removed by a dry etching method, whereby the contacting opening 61 is formed, and the high density N+ ion is implanted through said contacting opening 61 whereby the N+ ion implantation region 63 is formed.

Figure 6I:
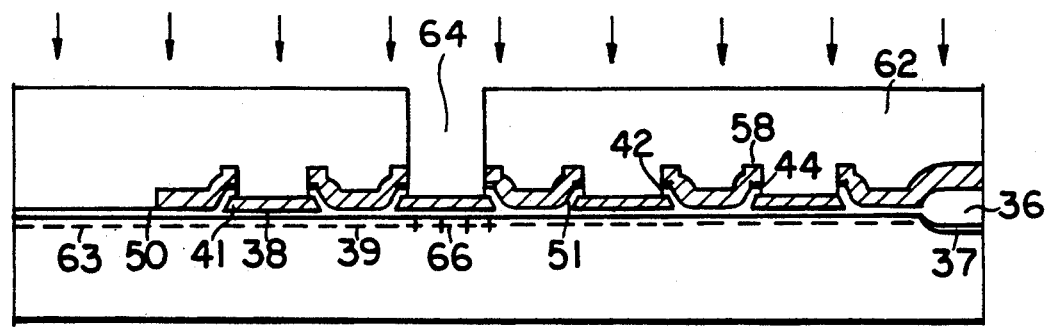

Referring to FIG. 6(I), after said photoresist film 60 is removed and successively photoresist film 62 is spread opening 64 is formed again by lithographic method in order to program the selected memory cell.

Thereafter, boron B of P-type impurities is implanted by 80-90 KeV and Doze $1.0\times10^{12}-4.0\times10^{12}/cm^2$ through said opening 64, whereby a part of memory cell formed of depletion type is changed to enhancement type.

Thus, when the boron B is implanted through said opening 64 to a part of the N-type channel 39, an enhancement N-type channel 66 is formed whereby data is programmed. Hereupon, portions of the second gate electrodes 58 are superposed with the first gate electrodes 41 to prevent opening 64 from being extended by mis-alignment or overdeveloping by photographic operation whereby an undesirable cell is programmed.

Thereafter, said photoresist film 62 is removed and an intermediate insulating film is formed by depositing the LTO film and BPSG film about 8500 Å and reflowing in a nitrogen environment at 925° C., at the same time, impurities of N+ ion implantation region 63 is driven in whereby N+ diffusion region 71 is formed. Then, when the intermediate insulating film 70 and the second gate oxide film 50 are etched by defining contacting region on the top portion of N+ diffusion region 71, and metal such as aluminum is sputtered at about 1 μm in thickness whereby the metal film 74 to be utilized as the bit line BL is formed, which comes to be the same as shown in FIG. 5. Said insulating film 70 between layers is formed with LTO film and PSG(Phospho Silicate Glass) film, or LTO film and BPSG (Boro-Phospho Silicate Glass) film.

Thus, it will be easily appreciated by those who have ordinary knowledge in this art that the present invention may have various modifications and variations within the scope and spirit without departing from the scope of the present invention.

Therefore, as described above, according to the present invention, the relationship between the first and the second polycrystalline silicon is isolated by utilizing an oxide film and a nitride film as well as a spacer, an area of chip that can be greatly reduced, and since the superposing portions of the first and the second gate electrodes are ion implanted with impurities of the same type as the substrate thereby being ion implanted to only the selected memory cell when the cell is programmed, even in case of occurring mis-alignment or overdevelopment, reliability can be enhanced because said impurities are programmed to only selected memory cells. Further, since the area as much as the superposed portions of first gate electrodes with the second gate electrodes and width of spacer are increased for the second gate electrodes, word line resistance is decreased, which has an advantage that active resistance is decreased by the contraction of the active region of the memory string.

What is claimed is:

1. In a process for producing a mask ROM device having a NAND type memory cell and having a high integration double polycrystalline silicon the steps comprising:

sequentially forming a pad oxide film and a nitride film on a first conductive type semiconductor substrate and then etching a predetermined region of the nitride film and ion-implanting first conductive type impurities into said substrate thereby forming an ion-implantation region;

forming a field oxide film on said ion-implantation region, removing said nitride film and ion-implanting second conductive type impurities thereby forming a depletion type channel;

removing the pad oxide film and forming sequentially a first gate oxide film, a first gate electrode substance, an oxide film, a nitride film and an LTO film on the substrate and the field oxide film;

etching a predetermined region of said LTO film, nitride film and oxide film, thereby forming a first gate electrode and exposing the substrate;

forming a second gate oxide film on said exposed substrate and LTO film and forming a spacer at the side surface of said first gate electrode;

depositing a second gate electrode substance on the second gate oxide film, the spacer and the LTO film;

sequentially etching said second gate electrode substance, LTO film, nitride film and oxide film on said LTO film thereby forming a second gate electrode;

etching a part of a predetermined second gate electrode of said second gate electrode, depositing a photoresist and forming an opening for an ion-implantation into a selected memory cell;

ion-implanting said first conductive type impurities into the selected memory cell thereby programming into a compensated enhancement type channel; and forming source and drain regions by ion-implanting said second conductive type impurities into the substrate to be formed source and drain regions, and then forming an insulating film on the whole surface of the second gate oxide film, the first gate electrode and the second gate electrode, and forming a connection opening on said second conductive type diffusion region, and forming a metal film for a bit line.

2. The method of manufacturing mask ROM device having integration double polycrystalline silicon according to claim 1, wherein said first and second gate electrodes are formed with polycrystalline silicon or polycide substance.

3. The method of manufacturing mask ROM device having high integration double polycrystalline silicon according to claim 2, wherein said polycide is either tungsten silicide, titanium silicide or molybdenum silicide.

4. The method of manufacturing a mask ROM device having integration double polycrystalline silicon according to claim 1, wherein said second gate electrode is formed by an etching back process.

5. The method of manufacturing mask ROM device having integration double polycrystalline silicon according to claim 1, wherein said non-selected memory cell is prevented from being programmed by mis-alignment or overdevelopment by ion-implanting first conductive type impurities to memory selected with spacer, and the first and second gates.

6. The method of manufacturing mask ROM device having high integration double polycrystalline silicon according to claim 1, wherein said insulating film is formed with a PSG film and LTO film or a BPSG film and an LTO film.

* * * * *